United States Patent [19]
Yi et al.

[11] Patent Number: 6,041,005
[45] Date of Patent: Mar. 21, 2000

[54] SEMICONDUCTOR MEMORY DEVICE

[75] Inventors: Seung Hyun Yi, Seoul; Jae Whan Kim, Kyungki-Do, both of Rep. of Korea

[73] Assignee: Hyundai Electronics Industries Co., Ltd., Kyungki-do, Rep. of Korea

[21] Appl. No.: 09/342,105

[22] Filed: Jun. 29, 1999

[30] Foreign Application Priority Data

Jun. 30, 1998 [KR] Rep. of Korea ................ 98-25993

[51] Int. Cl.[7] ............................. G11C 13/00
[52] U.S. Cl. .................. 365/207; 365/226; 365/208
[58] Field of Search .................... 365/208, 207, 365/226, 227, 189.01, 230.01

[56] References Cited

U.S. PATENT DOCUMENTS

| | | |
|---|---|---|
| 4,873,664 | 10/1989 | Eaton, Jr. . |
| 5,373,463 | 12/1994 | Jones, Jr. . |
| 5,381,379 | 1/1995 | Fukumoto . |
| 5,517,446 | 5/1996 | Ihara . |
| 5,574,679 | 11/1996 | Ohtsuki et al. . |
| 5,621,680 | 4/1997 | Newman et al. . |
| 5,640,030 | 6/1997 | Kenney . |
| 5,815,430 | 9/1998 | Verhaeghe et al. . |
| 5,835,400 | 11/1998 | Jeon et al. . |
| 5,953,276 | 9/1999 | Baker ........................... 365/208 |

FOREIGN PATENT DOCUMENTS

| | | |
|---|---|---|
| 9-288891 | 11/1997 | Japan . |
| 10-162589 | 6/1998 | Japan . |

*Primary Examiner*—Terrell W. Fears
*Attorney, Agent, or Firm*—Pennie & Edmonds LLP

[57] ABSTRACT

The present invention relates to semiconductor memory device and more particularly, to a technique for stabilizing the potential of the cell plate line by using two kinds of potentials for the cell plate line driver to implement the powerful driving force and rapid operability required in case of designing the RAM using as the memory device the material having large electrostatic capacity, and for preventing the loss of I/O by using CMOS transistors in the decoder circuit which receives the cell plate line voltage by cooperating with the cell plate line driver circuit and feeds back the cell plate line voltage.

6 Claims, 4 Drawing Sheets

SEMICONDUCTOR MEMORY DEVICE

BACKGROUND OF THE INVENTION

1. Field of the Invention

The present invention relates to a semiconductor memory device and, in particular, to a cell plate line driver circuit which can implement a strong drive power and rapid operability required in case of designing a RAM having a material of large electrostatic capacity as a memory device and a circuit for transferring an output of the cell plate line driver circuit to a cell plate line without loss.

2. Related prior art

A driver for driving a word line for controlling an In/Out of information in a memory device of DRAM memory semiconductor which is presently commercially available requires only a potential higher than or equal to a certain level.

Therefore, the word line driver plays a role of making ON/OFF the potential higher than or equal to the certain level and comprises, as shown in FIG. 1 a level shifter section 10 for shifting a voltage level, a driver section 30 for driving the output voltage of the level shifter section 10 to a word line, and a control section 40 for controlling the operation of the driver section 30.

In operation of the word line driver constituted as described above, when a control signal C1 applied to the control section 40 is enabled with a value "High", it turns on a N-MOS transistor N31 of the driver section 30 via each inverter INV41, 42 in the control section.

on the other hand, the control signal C1 is input to the level shifter section 10 via a delay 50 having a predetermined delay time, and thereafter operates the level shifter so as to apply a high voltage Vpp to the driver section 30 via a PMOS transistor P11, and eventually this voltage is applied to the word line.

FIG. 2 shows a voltage variation of each line varying in a process in which the above described operation is performed, and it can be seem from the drawing that the word line W/L gradually increases in its voltage to Vpp.

The word line driver operating as described above has small electrostatic capacity of memory device presently manufactured with silicon, and therefore, the driving capability of the driver is not very important.

However, when using a material of large electrostatic capacity including a ferroelectric materials instead of silicon which is a memory device of DRAM, in case of using a conventionally used word line driver structure as they are to a cell plate line drive, various problems occur.

In case of using the ferroelectric materials as a memory device, a certain level is required to the cell plate line.

In case of using the material of large electrostatic capacity as a memory device, since the material itself has very large electrostatic capacity in comparison to the silicon, it requires a strong driving capability.

Therefore, to commercialize a RAM using such material as a memory device, the word line driver circuit presently used in DRAM can not be used and new type of circuit is required.

SUMMARY OF THE INVENTION

In consideration of conventional requirements described above, an object of the present invention is to provide a driver circuit which satisfies the requirements required by the cell plate line driver when using the material of large electrostatic capacity including the ferroelectric material and a decoder circuit conforming to the driver circuit.

Other object of the present invention is to provide a semiconductor memory device which uses the cell plate line driver as the word line driver.

The constitution of the present invention to accomplish the object described above has a cell plate line driver circuit comprising: a high voltage application section for applying a high voltage Vpp to said cell plated line; an internal voltage application section for applying an internal voltage Vint to said cell plate line; a voltage comparison section for comparing a reference cell plate line CPL-ref potential and a potential of an internal voltage and for outputting to said each voltage application section; and a control section for controlling the operation of said each section.

The constitution of the present invention to accomplish the object described above has a decoder circuit including a decoder section and a cell array cooperating with a cell plate line driver comprising: a selection section for selectively applying to a cell of which a word line is enabled a cell plate line voltage inputted from said cell plate line driver circuit; and an output section for inputting a signal CPL-ref to a voltage comparison section of said cell plate line driver if said cell plate line voltage applied through said selection section is shifted to said reference cell plate line CPL-ref voltage through a cell array; and wherein switching devices constituting said selection section and output section prevent loss of I/O signal by using CMOS transistors.

In addition, a semiconductor memory device to accomplish the object described above comprises:

(A) a cell plate line driver circuit using a plurality of potentials to stabilize a potential of a cell plate line CPL comprising: a high voltage application section for applying a high voltage Vpp to said cell plate line; an internal voltage application section for applying an internal voltage Vint to said cell plate line; a voltage comparison section for comparing a reference cell plate line CPL-ref potential and a potential of an internal voltage and for outputting to said each voltage application section; and a control section for controlling the operation of said each section; and (B) a decoder circuit comprising: a selection section for selectively applying to a cell of which a word line is enabled a cell plate line voltage inputted from said cell plate line driver circuit; and an output section for inputting a signal CPL-ref to a voltage comparison section of said cell plate line driver if said cell plate line voltage applied through said selection section is shifted to said reference cell plate line CPL-ref voltage through a cell array.

BRIEF DESCRIPTION OF THE DRAWINGS

The above object and other advantages of the present invention will become more apparent by describing in detail the preferred embodiment of the present invention with reference to the attached drawings in which.

Similar reference characters refer to similar parts in the several views of the drawings.

DETAILED DESCRIPTION OF THE INVENTION

Embodiments of the present invention will be described in detail with reference to the accompanying drawings.

The concept of the present invention is to use an electric source having two different potentials at the cell plate line driver stage to supply a certain potential to the cell plate line in short time and is to drive initially by connecting the electric source of high potential and to stabilize the potential of cell plate line by connecting the electric source of low potential if a certain level is reached, and the scheme of decoding the cell plate line is to transfer the output produced by the cell plate line driver stage to the cell plate line without loss by connecting a switch to a decoder.

Figure 1:
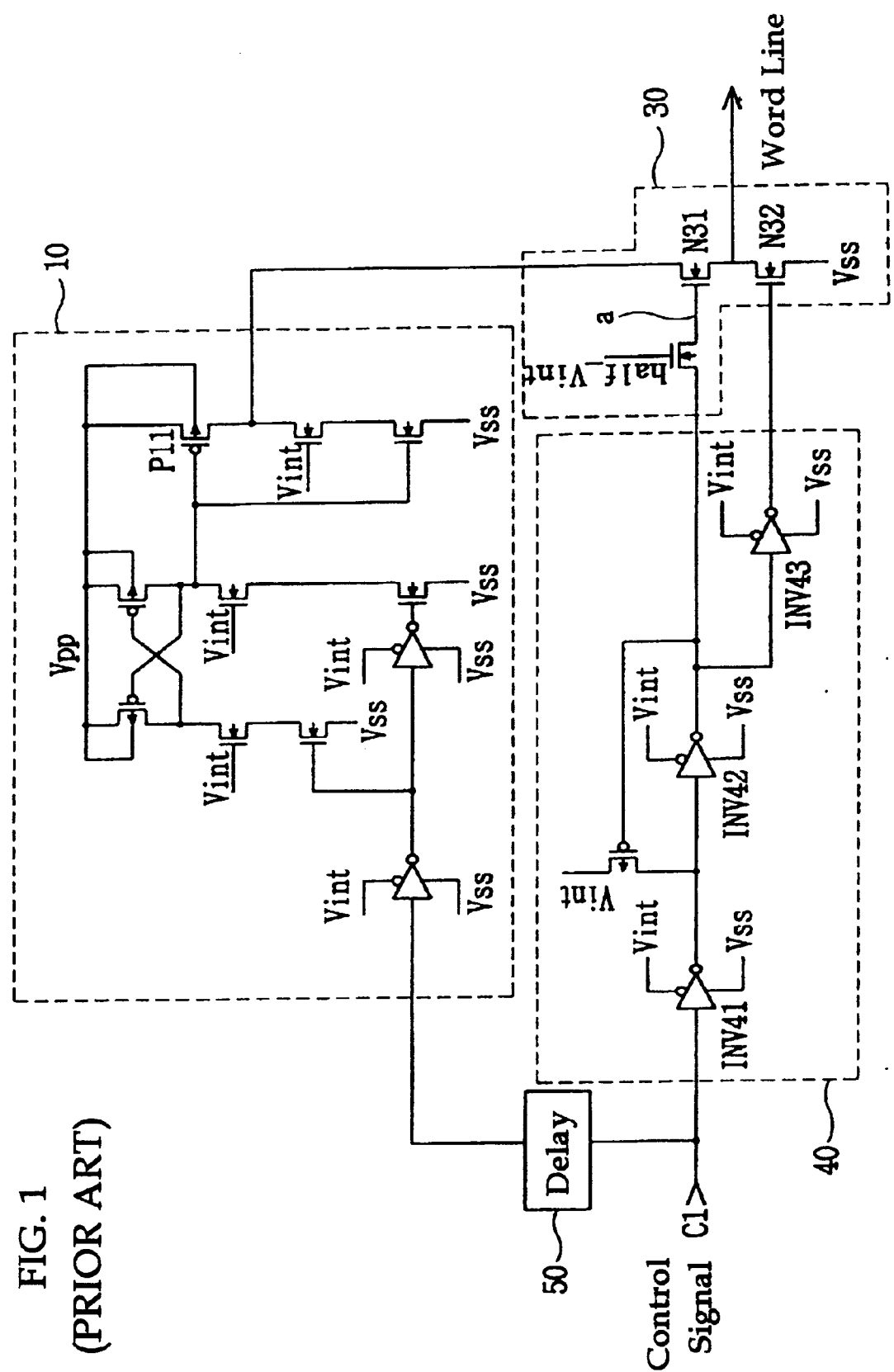
FIGS. 1 shows a word line driver circuit diagram of DRAM using the conventional silicon as a memory device.
Figure 2:
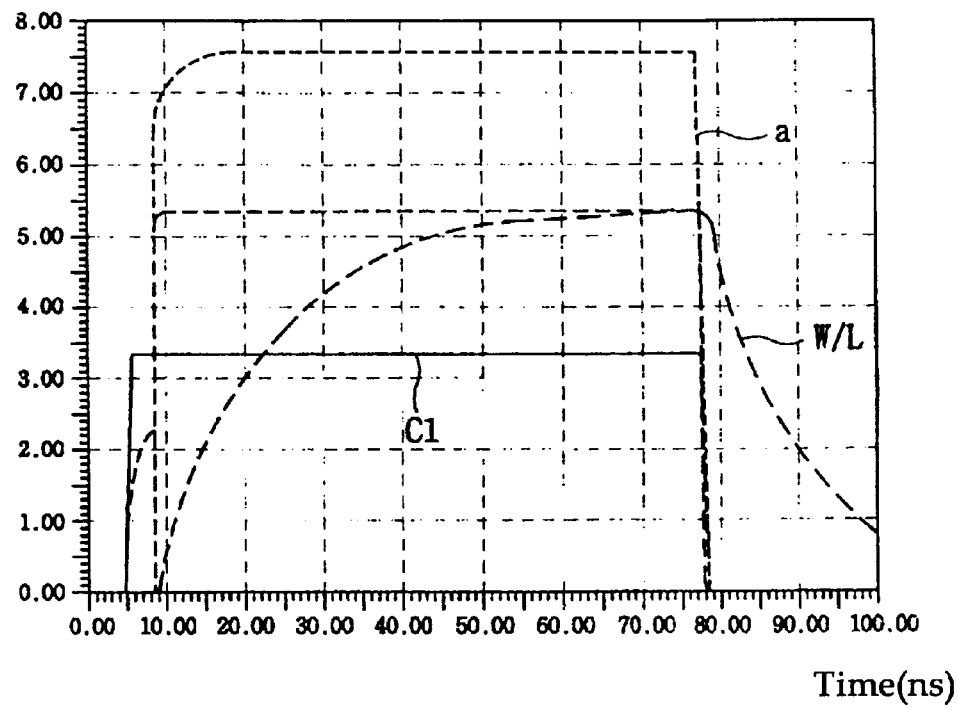
FIGS. 2 shows a graph showing a voltage variation of each node at the time of operation of circuit of FIG. 1.
Figure 3:
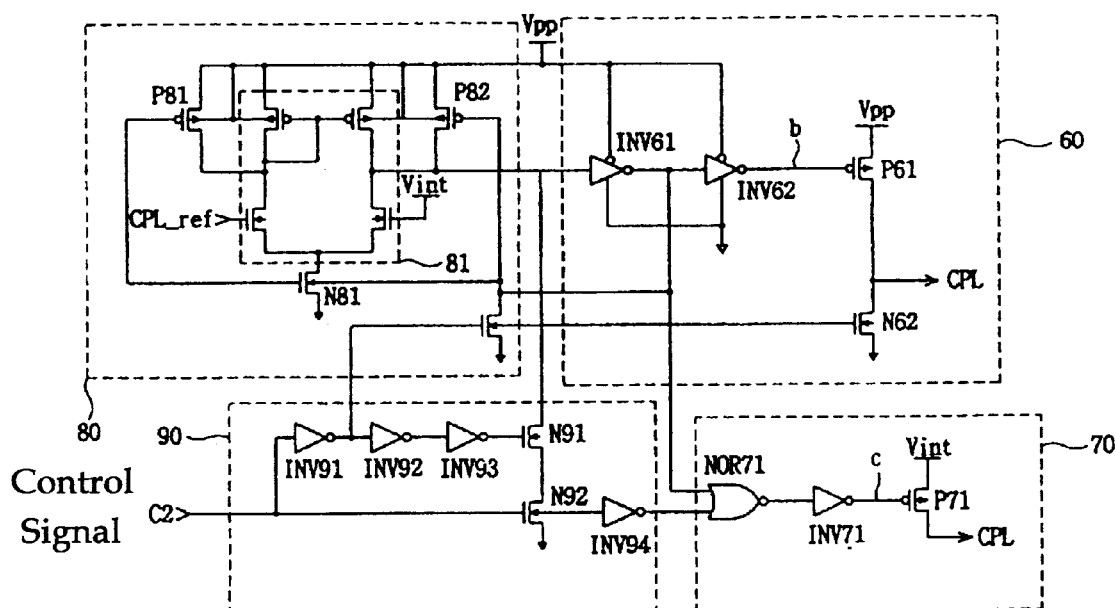
FIGS. 3 shows a cell plate line drive circuit diagram of RAM of the present invention using as a memory device a material of large electrostatic capacity.

A cell plate line driver circuit according to the present invention as shown in FIG. 3 comprises:

- a high voltage application section 60 for applying a high voltage Vpp to said cell plate line;
- an internal voltage application section 70 for applying an internal voltage Vint to said cell plate line;
- a voltage comparison section 80 for comparing a reference cell plate line CPL-ref potential and a potential of an internal voltage and for outputing to said each voltage application section; and
- a control section 90 for controlling the operation of said each section.

The high voltage application section 60 comprises:

- a plurality of inverting devices INV61 and INV62 for inverting the signal outputted from said voltage comparison section 80;
- a PMOS transistor P61 for outputting the high voltage Vpp to said cell plate line CPL by being turned on/off by the signal outputted from said inverting device INV62; and
- a N-MOS transistor N61 connected to one terminal of said P-MOS transistor P61 and turned on/off according to the signal outputted from said control section 90.

The internal voltage application section 70 comprises:

- a NOR-gate NOR71 for operating a signal outputted from said inverting device INV61 in said high voltage application section 60 and a signal outputted from said control section 90;
- an inverting device INV71 for inverting a signal outputted from said NOR-gate NOR71;
- a PMOS transistor P71 for outputting an internal voltage Vint to said cell plate line CPL by being turned on/off by the signal outputted from said inverting device INV71.

The voltage comparison section 80 comprises: a differential amplifier 81 for receiving and differentially amplifying a reference cell plate line voltage CPL-ref and said internal voltage. applying the high voltage Vpp to CPL if said CPL-ref potential is lower than said internal voltage Vint and applying said internal voltage Vint to CPL if said CPL-ref potential is higher than said internal voltage Vint; and a plurality of PMOS transistors P81 and P82 and N-MOS transistors N81 and N82.

The control section 90 comprises a plurality of inverting device INV91 to INV94 for receiving and inverting a control signal C2 and NMOS transistors N91 and N92.

The operation of the cell plate line driver circuit implemented as described above will be explained. If the control signal C2 is enabled to a value "High" and input, the voltage comparison section 80 starts to operate and if a potential CPL-ref among signals inputted to the differential amplifier 81 is lower than a potential Vint, the voltage comparison section 80 outputs a "Low" value.

This Low value turn on the P-MOS transistor P61 via each inverting device INV61 and INV62 of the high voltage output section 60 so as to apply the high voltage to CPL.

At the same time, a "High" signal outputted from the inverting device INV61 is inputted to a terminal of NOR-gate NOR71 of internal voltage output section 70, and a "Low" value generated by inverting the control signal C2 by the inverter INV94 is inputted to the other terminal of the NOR-gate NOR71.

Therefore, "Low" value is output form the NOR-gate NOR71, and the P-MOS transistor P71 is turned off so as to prevent the internal voltage from being outputted to CPL.

On the other hand, if the potential CPL-ref at the differential amplifier 81 is higher than Vint, "High" value is outputted and this value turns off the P-MOS transistor P61 of high voltage output section 61 so as to prevent the high voltage from being outputted and turns on the P-MOS transistor P71 of internal voltage output section 70 so as to apply Vint to CPL.

At this time, Vpp is the electric source having higher potential than that actually supplied to CPL, and Vint is the electric source having same potential as that supplied to W/L.

CPL-ref being compared with Vint is the voltage value (refer to FIG. 5) of the porting to which the weakest electric source is supplied in case where the potential is connected to the cell plate line.

Figure 4:
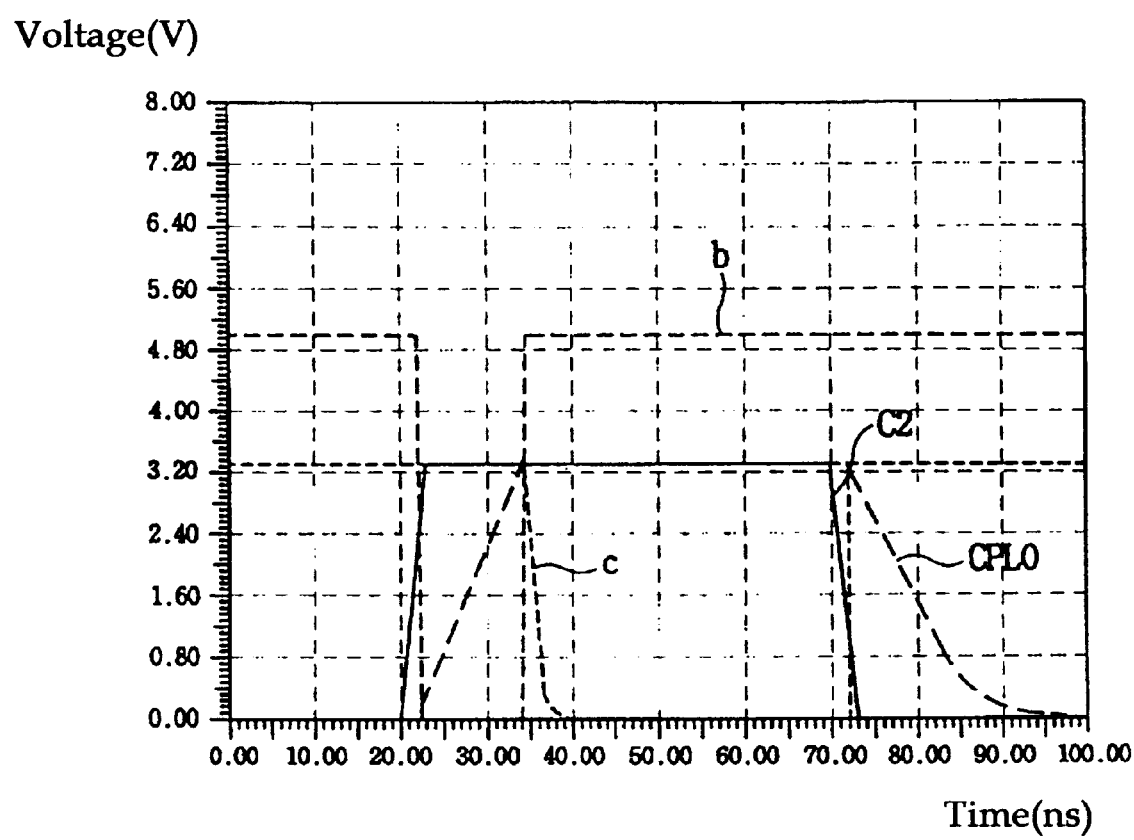
FIGS. 4 shows a graph showing a voltage variation of each node at the time of operation of circuit of FIG. 3.

FIG. 4 shows a voltage variation of each line varying in the process in which the operation described above is performed. As shown in the drawing, the cell plate line CPL is fast driven up to Vint potential, and does not go up to Vpp potential but maintain Vint potential. In the drawing, control-Vpp is the gate stage b of the high voltage output section 60, and maintains the "Low" state until the cell plate line reaches Vint potential so as to supply Vpp to the cell plate line.

In the drawings, it can be seen that control-Vint is a gate stage c of the Vint application section 70 and is enabled to "Low" state to maintain the cell plate line to Vint potential after the Vpp application section 60 is turned off.

Figure 5:
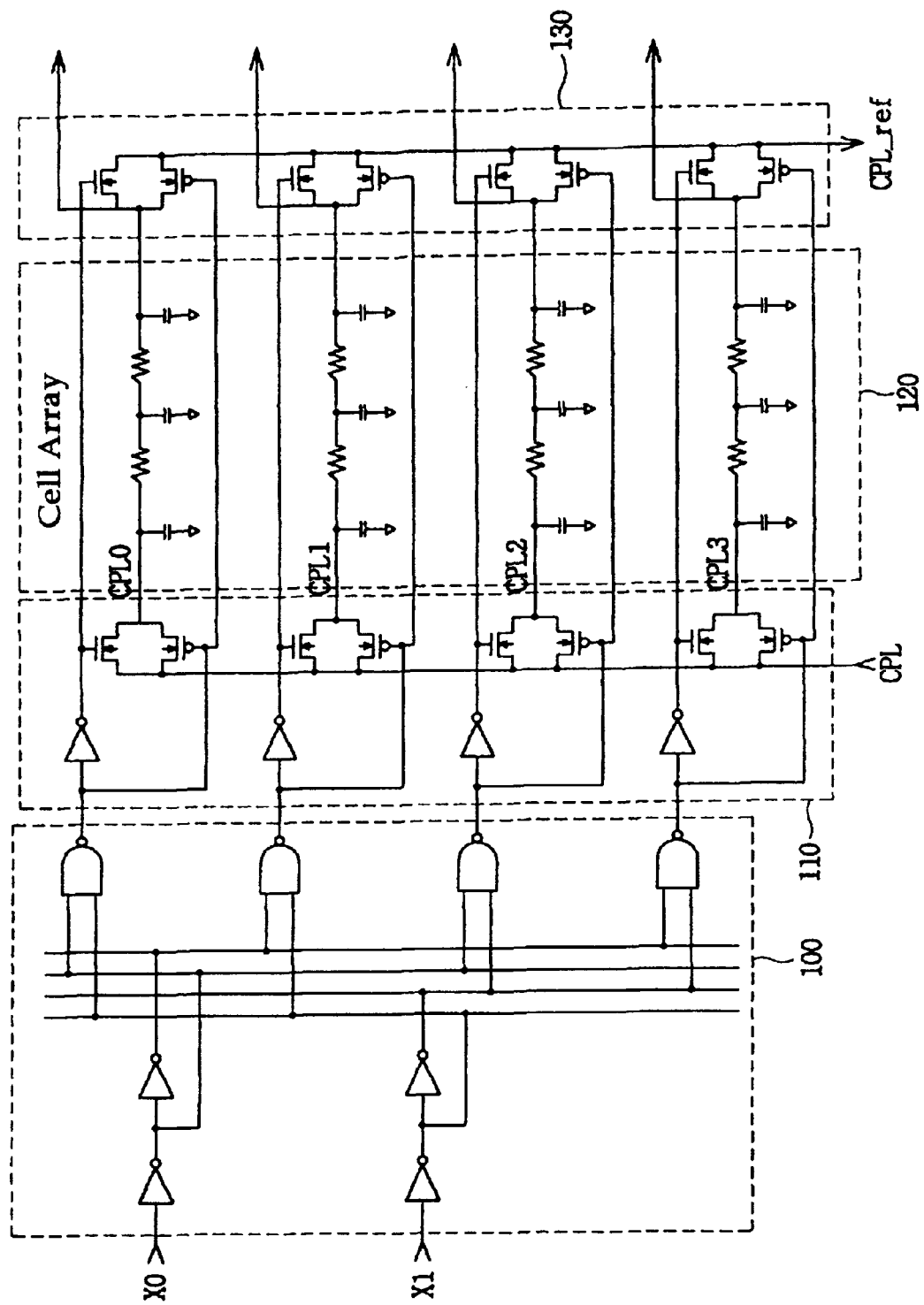
FIGS. 5 shows a decoder circuit diagram using an output of the cell plate line driver according to the present invention.

FIG. 5 shows a circuit which shows a condition in which CPL outputted from FIG. 4 is applied to a cell array and which shows a decoder section and a cell array.

FIG. 5 comprises:

- a decoder section 100 for receiving and decoding a row address X-address;
- a selection section 110 for enabling the word line by inverting a signal outputted from said decoder section 100 and, at the same time, for applying to a cell of which a word line is enabled the CPL applied from said cell plate line driver;
- a cell array 120; and
- an output section 130 for outputting CPL-ref which is CPL voltage having passed through said cell array 120.

At this time, all of the switching devices used in the selection section 110 and output section 130 use CMOS transistors so as to transfer the output generated at the cell plate line driver to the cell plate line without loss.

In operation of the cell array constructed as described above, if each of X-addresses X0 and X1, for example, is inputted as "Low" value, the uppermost decoder is selected and the output of this decoder becomes "Low" value.

This signal, in turn, becomes "High" through the inverting element of the selection section 110 so as to select the word line, and at the same time, the switch is turned on so that CPL voltage is applied to the cell.

Then, the CPL voltage is lowered down to some extent by resistors when the CPL voltage goes through the word line, thereafter outputted through the output section 130 as CPL-ref voltage, and inputted to the voltage comparison section 80 of FIG. 3.

At this time, the CPL-ref voltage is the voltage of presently enabled line among the lines which have been decoded to give outputs.

Although the cell array circuit of the present invention acting as described above is implemented to decode four cell plate lines, it is of course understood that the number of the lines can be extended to 8, 16 and even more.

As described above in detail, the present invention has advantages of stabilizing the potentia of the cell plate line by using two kinds of potentials for the cell plate line driver used in case of commercializing the RAM, which uses as the memory device the material having large electrostatic capacity including the ferroelectric materials, instead of the RAM which presently uses silicon as the memory device.

In addition, the decoder circuit cooperating with the cell plate driver circuit cooperating with the cell plate driver circuit eliminates the loss of signal input/output by using the CMOS transistor as the switching device.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention

What is claimed is:

1. A cell plate line driver circuit using a plurality of potentials to stabilize a potential of a cell plate line comprising:

a high voltage application section for applying a high voltage to said cell plate line;

an internal voltage application section for applying an internal voltage to said cell plate line;

a voltage comparison section for comparing a reference cell plate line potential and a potential of an internal voltage and for outputing to said each voltage application section; and a control section for controlling the operation of said each section.

2. The cell plate line driver circuit of claim 1, wherein said high voltage application section comprises:

a plurality of inverting devices for inverting the signal outputted from said voltage comparison section;

a first switching device for outputting the high voltage to said cell plate line by being turned on/off by the final output signal of said inverting device; and a second switching device connected to one terminal of said switching device and turned on/off according to the signal outputted from said control section.

3. The cell plate line driver circuit of claim 1, wherein said internal voltage application section comprises:

an operation means for operating a signal outputted from said inverting device in said outputted from said inverting device in said high voltage application section and a signal outputted from said control section;

an inverting device for inverting a signal outputted from said operation means;

a third switching device for outputting an internal voltage to said cell plate line by being turned on/off by the signal outputted from said inverting device.

4. The cell plate line driver circuit of claim 1, wherein said voltage comparison section comprises:

a differential amplifier for receiving and differentially amplifying a reference cell plate line voltage and said internal voltage, applying the high voltage to said cell plate line if said reference cell plate line voltage is lower than said internal voltage and applying said internal voltage to said cell plate line if said reference cell plate line voltage is higher than said internal voltage; and a plurality of MOS transistors.

5. A decoder circuit in a semiconductor memory for transferring to a cell plate line an output of a cell plate line driver supplying a plurality of voltages comprising:

a selection section for selectively applying to a cell of which a word line is enabled a cell plate line voltage inputted from said cell plate line driver circuit; and an output section for inputting a reference cell plate line voltage to a voltage comparison section of said cell plate line driver if said cell plate line voltage applied through said selection section is shifted to said reference cell plate line voltage through a cell array; and wherein switching devices constituting said selection section and output section prevent loss of I/O signal by using CMOS transistors.

6. A semiconductor memory device comprising:

(A) a cell plate line driver circuit using a plurality of potentials to stabilize a potential of a cell plate line comprising:

a high voltage application section for applying a high voltage to said cell plate line;

an internal voltage application section for applying an internal voltage to said cell plate line;

a voltage comparison section for comparing a reference cell plate line potential and a potential of an internal voltage and for outputing to said each voltage application section; and a control section for controlling the operation of said each section; and (B) a decoder circuit comprising:

a selection section for selectively applying to a cell of which a word line is enabled a cell plate line voltage inputted from said cell plate line driver circuit; and an output section for inputting a reference cell plate line voltage to a voltage comparison section of said cell plate line driver if said cell plate line voltage applied through said selection section is shifted to said reference cell plate line voltage through a cell array.

* * * * *